United States Patent [19]

Neal

[11] Patent Number: 4,851,843

[45] Date of Patent: Jul. 25, 1989

[54] ANALOGUE-TO-DIGITAL CONVERSION APPARATUS

[75] Inventor: Martin Neal, Wotton-under-Edge, United Kingdom

[73] Assignee: Renishaw plc, Gloucestershire, United Kingdom

[21] Appl. No.: 244,597

[22] Filed: Sep. 13, 1988

Related U.S. Application Data

[63] Continuation of Ser. No. 47,920, Apr. 28, 1987, abandoned.

[30] Foreign Application Priority Data

Sep. 16, 1985 [GB] United Kingdom ............... 8522875

[51] Int. Cl.$^4$ ........................................... H03M 1/18
[52] U.S. Cl. ..................................... 341/139; 341/168
[58] Field of Search ........................ 341/116, 139, 168

[56] References Cited

U.S. PATENT DOCUMENTS 3,754,240  8/1973  Milton ........................... 340/347 NT
4,375,636  3/1983  Stack et al. ................... 340/347 SY

OTHER PUBLICATIONS

International Zurich Seminar on Digital Communications, 12-15, Mar. 1974, Zurich/Switzerland.
Messen Steuern Regeln, vol. 18, No. 6, Jun. 1975 (Berlin, DD), P. Ernst: "Floating Point Analog/Digital Convectors".

Primary Examiner—William M. Shoop, Jr.
Assistant Examiner—Marc S. Hoff
Attorney, Agent, or Firm—Oliff & Berridge

[57] ABSTRACT

Apparatus including an analogue-to-digital converter 26 having a given number of digits, includes a variable gain amplifier (23) for the input (VA) to the converter (26). If any one instantaneous value (21A) of the input (VA) is less than is necessary to saturate the converter (26), i.e. to use all the digits of the converter (26), the gain of the amplifier (23) is automatically set to amplify the instantaneous input (21A) to the extent necessary to saturate the converter (26). By such selective amplication of different outputs (VA), each instantaneous value (21A) is digitized by the full number of digits of the converter (26) and the resolution of the apparatus is the same for all inputs (VA) regardless of their magnitude. On the other hand the converter is not over-saturated such as could be the case if the different inputs (VA) were amplified by a common gain.

9 Claims, 5 Drawing Sheets

ANALOGUE-TO-DIGITAL CONVERSION APPARATUS

This is a continuation of application Ser. No. 047,920, filed Apr. 28, 1987 now abandoned.

BACKGROUND OF THE INVENTION

This invention relates to an analogue-to-digital conversion apparatus.

Known said apparatus includes an analogue-to-digital converter and a system for controlling the analogue input to the converter. The converter may be said to divide each instantaneous input value according to the expression $V/2^n$ where V is the maximum input value and n is the number of digits of the converter necessary to express the input value in binary terms. The resolution may be said to be based on the divisor $2^n$. The value $V/2^n$ defines the basic resolution of the apparatus and may be regarded as the smallest fraction of V which the converter can identify or the smallest change of the input which the converter can resolve. Thus if the input value is said maximum, the converter can identify $2^n$ steps. If a smaller input value is applied, the number of steps is reduced to $2^{n-q}$, where q=the number of digits, at the most significant end of the converter, remaining "0". Therefore, if the input is smaller, the effective resolution by which this input may be described is reduced. If it is then desired to improve the resolution, this can be done in a known said system by amplifying the input value to the extent that more of the digits of the converter are used. The resolution is then improved because the input value is divided by a larger number than would be otherwise the case.

However, a difficulty arises if the input value varies over a range the upper values of which are close to the numerical range of the converter, i.e. close to the condition in which all digits of the converter become binary "1". In such a case the resolution of the lower values of the input range cannot be improved by amplification because the correspondingly amplified upper values of the input range would then lie outside the numerical range of the converter, and the converter becomes "over-ranged". The difficulty is particularly acute if the input values vary randomly or in an unpredictable manner. An example of this is found in cases where the input is derived from a varying light signal. It is an object of this invention to overcome or reduce this difficulty.

SUMMARY OF THE INVENTION

The scope of this invention is specified in the claims hereto.

It will be seen that the invention ensures that if the most significant bit, or any next most significant bit, is "0", i.e. the input is not large enough for the first digital word to use all digits of the converter, the gain is increased to raise the input value by a factor such that, when the converter is operated for the second time the resulting binary number uses all digits of the converter with corresponding benefit in resolution. More specifically, if the converter has n digits and if the input value was so small as to vacate the first q digits of the converter, the resolution becomes $V/2^{n+q}$. It may therefore be said that as far as said small input value is concerned, it was digitised as if the converter had n+q digits, i.e. had q additional digits.

BRIEF DESCRIPTION OF DRAWINGS

A preferred embodiment of this invention, and a modification, will now be described, by way of example, with reference to the accompanying drawings wherein:-

DESCRIPTION OF PREFERRED EMBODIMENT

Figure 1:
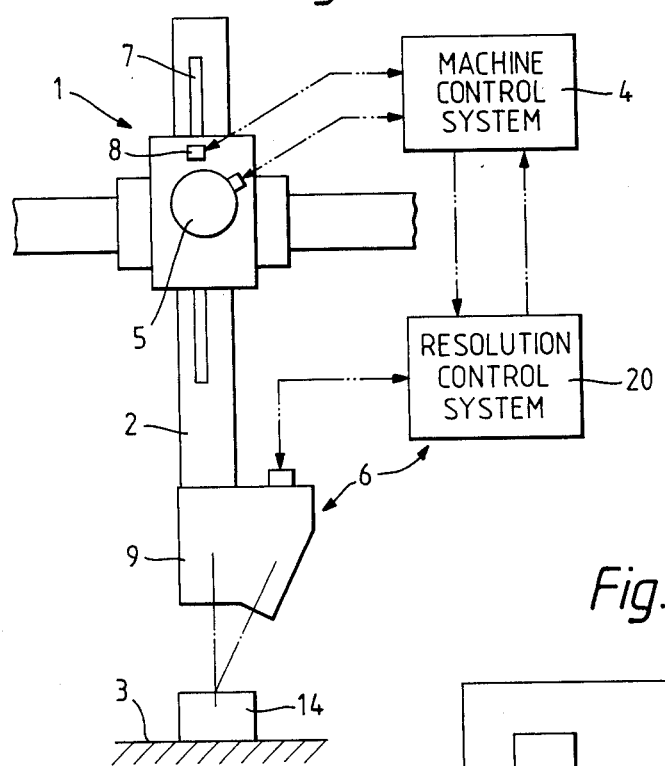
FIG. 1 is an elevation of a part of a coordinate measuring machine.

Referring to FIG. 1, the machine, generally denoted 1 comprises a member 2 adapted to be moved relative to a table 3 in three dimensions X, Y, Z under the control of a machine control system 4. For example, movement in the Z dimension is effected by a motor 5. The machine 1 is equipped with a machine measuring system 6, indicated by a scale 7, for monitoring the position of the member 2. A workpiece 14 mounted on the table 3 can be measured by the machine measuring system 6 in terms of the position of the member 2 relative to a datum, use being made of a position sensing probe 9 secured to the member 2. The probe 9 has a probe measuring system 8 (to be described further) whereby to determine the position of a surface 14A of the workpiece 14 relative to the member 2 within a given dimensional range. Thus the machine measuring system 6 may be used to move the member 2 to a given position relative to the surface 14A and the probe measuring system may be used to indicate any error by which the actual position of the surface deviates from the given position.

Figure 2:
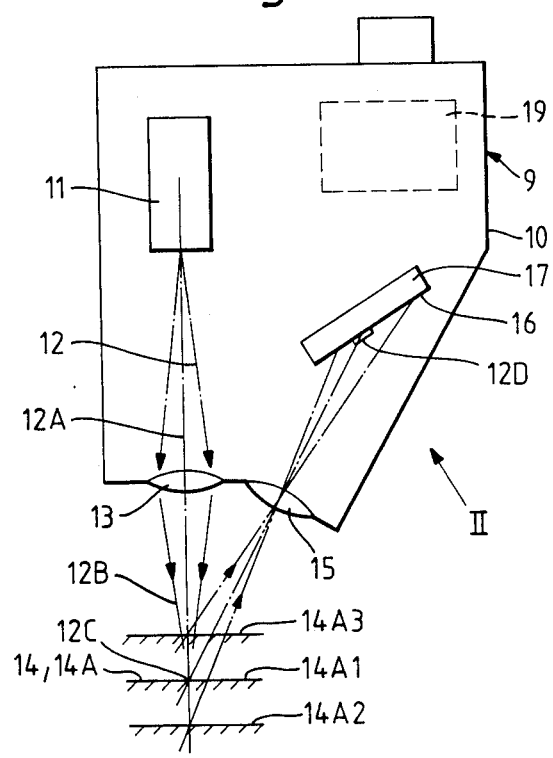
FIG. 2 is a diagrammatic illustration of a probe for sensing position.
Figure 3:
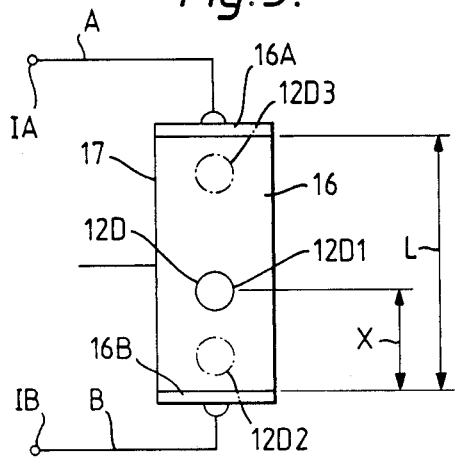
FIG. 3 is an enlarged detail of FIG. 2 as seen in the direction of an arrow II.

Referring to FIGS. 1 to 3, the probe 9 comprises a housing 10 containing an infrared laser light souce 11 producing an incident beam 12 of light, and a lens 13 adapted to converge the beam to a waist 12B. The housing 10 is secured to the member 2. For the purpose of taking a measurement the probe is arranged for the axis, 12A, of the beam 12 to be substantially perpendicular to the surface 14A. Different relative positions of the surface 14A are denoted 14A1, 14A2, 14A3. When, during movement of the member 2 the waist 12B is intersected by the surface 14A, the surface 14A is illuminated at a small spot 12C. The housing 10 includes a lens 15 adapted to image the spot 12C onto a light-sensitive surface 16 of a transducer 17 there to form a spot 12D. Movement of the probe 9 in the direction of the axis 12A results in a change of the position of the spot 12D between positions 12D1, 12D2, 12D3 corresponding to the relative surface positions 14A1, 14A2, 14A3. The spot 12D causes photo-current to be generated at electrodes 16A, 16B of the transducer 17. The relative magnitudes of these currents is an indication of the position of the spot 12D and the latter position can be determined by the following derivation:

$$IA = IO*(L-X)/L \tag{1}$$

$$IB = IO*(X/L) \quad (2)$$

$$(IA-IB)/(IA+IB) = 1-(2X/L) \quad (3)$$

where
- IO is the light intensity, incident upon the surface 16.
- IA = is an electric current being the output of electrode 16A.
- IB = is an electric current being the output of electrode 16B.
- L = distance between the electrodes.
- X = distance between the electrode 16A and the spot 12D and this distance is a measure of the relative position of the member 2 and the surface 14A.

It will be seen that the distance X is derived from expression (3) essentially in terms of the ratio of the currents IA, IB through the electrodes 16A, 16B. Generally, the transducer 17 is a device for measuring a parameter, i.e. X, which is a function of the ratio of the signals IA, IB.

Figure 4:
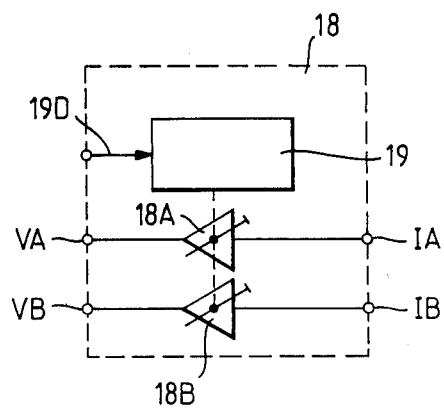
FIG. 4 is a schematic diagram of a current-to-voltage converter for the system shown in FIG. 5.
Figure 5:
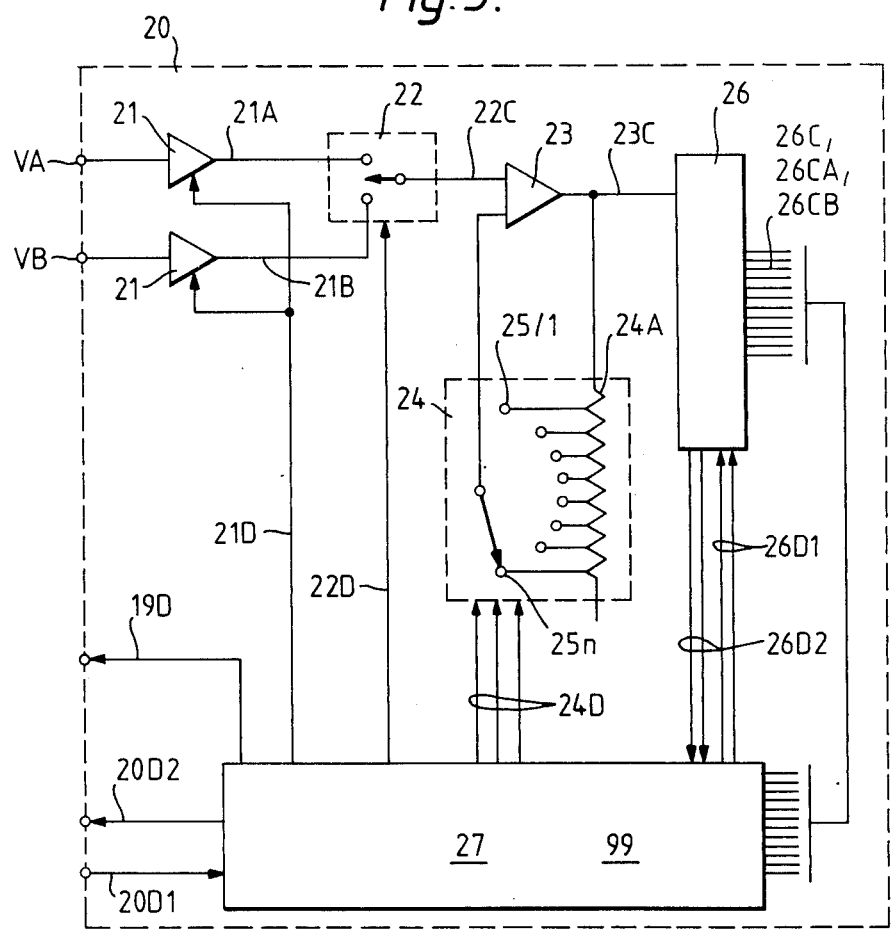
FIG. 5 is a schematic diagram of the resolution control system.
Figure 7:
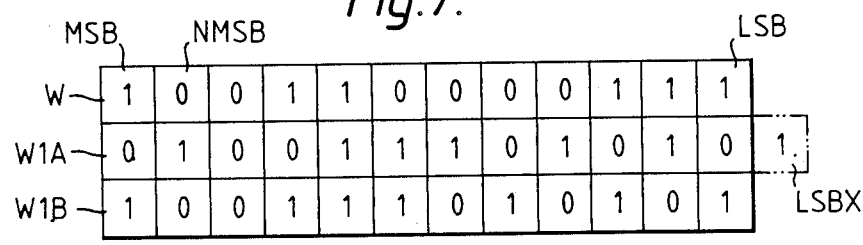
FIG. 7 is a representation of a register array showing an example of binary numbers stored herein.

In operation of the probe 9, the intensity IO of the light reaching the transducer can vary randomly over a wide range as a consequence of variations in the optical conditions of the surface 14A. One such condition is the disposition of microfacets, that is the different angles of small surfaces formed e.g. by polishing marks. Another such condition is interference patterns or speckle created in the reflected light due to coherence of the incident light. Due to those optical conditions very small changes in the relative position of the probe 9 and the surface 14A, changes which may in fact be less than the resolution of the probe measuring system, can lead to very widely varying light intensities at the spot 12D. As will be seen such variations would have the effect of varying the resolution of the probe measuring system 8 because the lower the light intensity the less use is made of the digits of an analogue-to-digital converter 26 (FIG. 5) used in the system 8. To cope with this, the latter system includes a resolution control system 20 adapted to keep the resolution constant. Briefly, the system 20 is designed to selectively amplify the input to the converter such that the lower the intensity IO the greater is the amplification and, as will be seen, the arrangement is such that, as a consequence of such selective amplification, the resolution remains constant. The resolution control system 20 is described in detail next below. Referring to FIG. 4 and 5, the current outputs IA, IB of the transducer 17 are connected to respective channels A, B. A current-to-voltage converter 18 (FIG. 4) converts the signals IA, IB into corresponding voltage signals VA, VB. The converter 18 includes variable gain amplifiers 18A, 18B whose gains are settable collectively and in predetermined steps by a gain setting device 19 operably by a binary signal 19D. The input signals VA, VB are fed to respective sample-and-hold circuits 21 (FIG. 5), also known per se as "track-and-hold" circuits which are operable collectively and at discrete intervals of time by a binary signal 21D to hold the amplitudes of the signals VA, VB at respective instantaneous values 21A, 21B. The signals 21A, 21B are fed to a multiplexer 22 operable by a binary signal 22D for passing the signals 21A, 21B selectively to a single output 22C. The latter output is fed to a variable gain amplifier 23 having an output 23C. The amplifier 23 has a gain setting device 24 in its feedback path. The device 24 is operable by a binary signal GN for selection of different discrete values of gain GA from 1 to n by switching the feedback through different terminals 25/1 to 25/n of a resistor system 24A. The signal GN defines nominal gain values variable as the series 1, 2, 4, 8, 16 etc. The gain values GA are corresponding actual gains. The selection of any one terminal 25 results in a gain GA having, at least nominally, a value twice that of the value resulting from selection of the immediately preceding terminal. The output 23C of the amplifier 23 is fed to said analogue-to-digital converter 26 whose output 26C is a binary word, such as that denoted W, entered in a register array 28 (FIG. 7) forming part of the controller 27. The converter is in this example, a twelve bit converter (FIG. 7). Correspondingly each register of the array has twelve bits. According to its magnitude, the word W may use one or more of these bits. The output 26C is also denoted 26CA or 26CB according to whether channel A or B is in use. Operation of the converter 26 is initiated by a binary signal 26D1 and completion of any one conversion is shown by a binary signal 26D2.

Figure 6A:
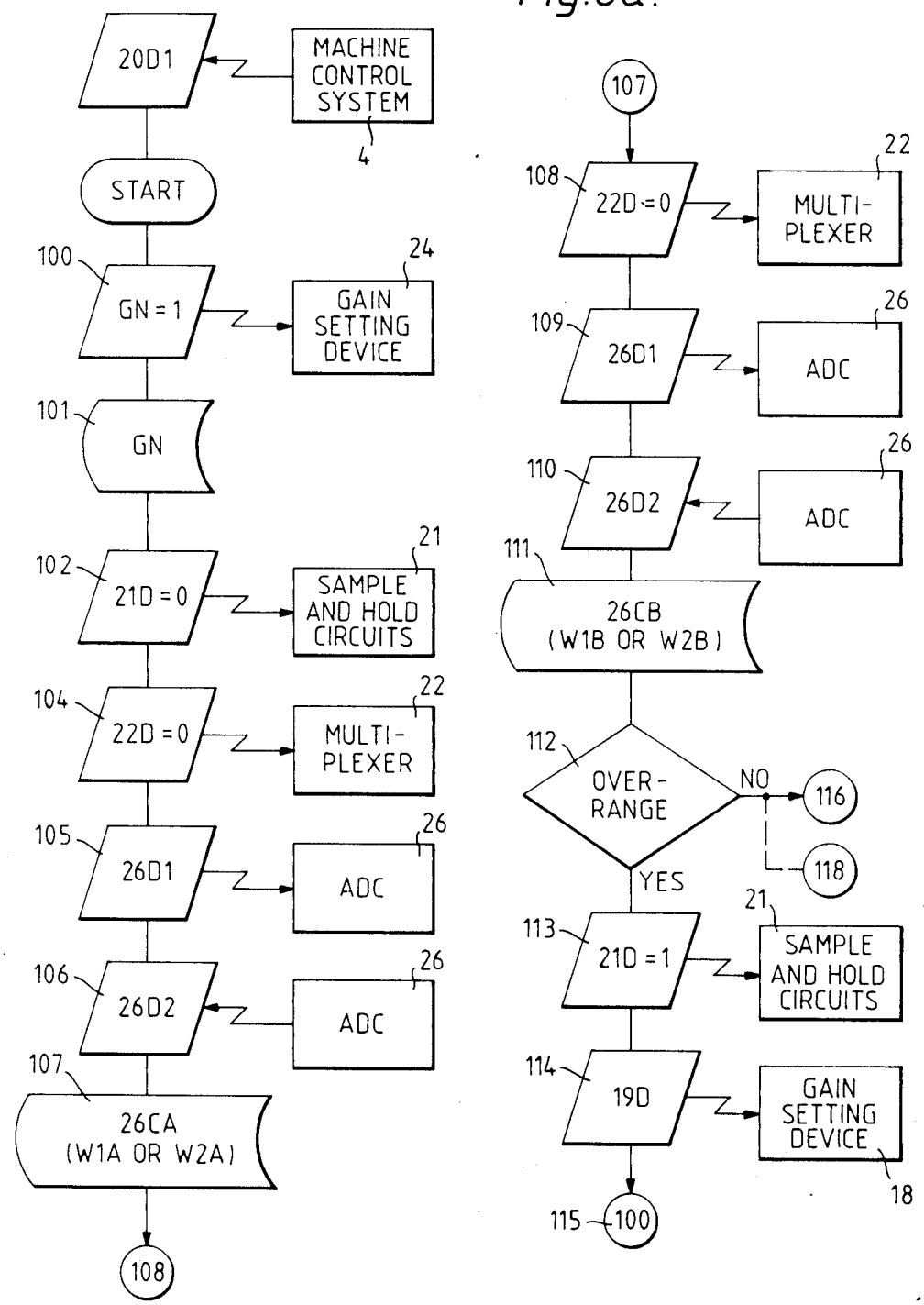
FIGS. 6a, 6b and 6c are successive parts of a flow diagram of a program pertaining to the resolution control system.
Figure 6B:
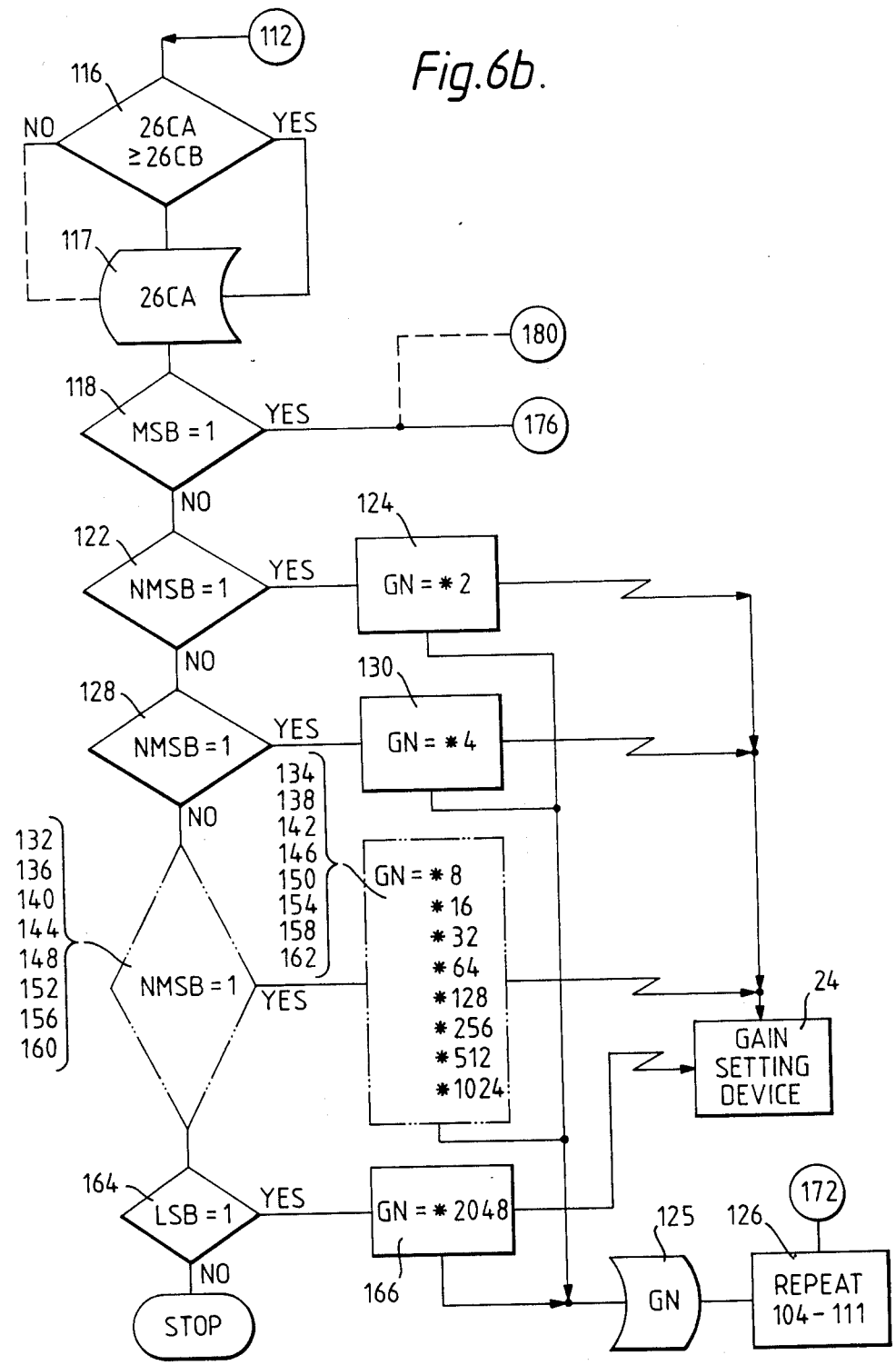

The resolution control system includes a controller 27 for the signals 19D, 21D, 22D, 24D, 26D1, 26D2. Operation of the controller is started by a signal 20D1 from the machine control system 4 (FIG. 1) as part of a measuring operation and the output of the proble measuring system 8 is sent to the system 4 by a signal 20D2. The controller may be in the form of hard-wired circuits or, as in the present example, in the form of a microprocessor containing a program 99 (FIGS. 6a, 6b, 6c) by virtue of which the controller 27 is adapted to perform automatically and sequentially a cycle comprising the following steps:

100: Set the gain signal GN to unity by switching the resistor 24A to terminal 25/1. This is an initialization step.
101: Store GN.
102: Set the signal 21D to "0" thereby operating the circuits 21 to hold both the inputs VA, VB at their respective instantaneous values 21A, 21B.
104: Set the signal 22D to "0" thereby operating the multiplexer 22 to connect the value 21A to the amplifier 23.
105: Output the signal 26D1 thereby initiating operation the converter 26 to produce an output value 26CA, defining a digital word W1A shown in FIG. 7.
106: Wait for and read the completion of operation signal 26D2 from the converter 26.
107: Store the value 26CA.
108: Set the signal 22D to "1" thereby operating the multiplexer 22 to connect the value 21B to the amplifier 23.
109: Output the signal 26D1 again thereby operating the converter to produce an output value 26CB, defining a digital word W1B (not shown).
110: Wait for and read the signal 26D2 from the converter 26.
111: Store the value 26CB.
112: Decision as to whether the converter 26 is overranged i.e. whether the inputs VA or VB are greater than the numerical range of the converter. If "yes" go to step 113. If "no" go to step 116.
113: Set signal 21D to "1" thereby operating the circuit 21 to release the inputs VA, VB from the instantaneous values at which they were held by step 102.
114: Output the signal 19D to change the amplifiers 18A, 18B to the next lower gain setting.

115: Go to step 100 to repeat steps 100 to 111 at the lower values of the inputs VA, VB. Steps 112 to 115 initialize the input of the resolution control system 20.

116: Decision to determine which of the values 26CA, 26CB has the greater magnitude. The greater value needs to be selected because as will be seen, both values have to be amplified by the same gain factor. If the smaller value were selected the resulting amplification could bring the larger value beyond the numerical range of the converter 26.

117: Output the greater value, assumed here to be the value 26CA i.e. the word W1A, to the array 28 (FIG. 7).

118: Decision to determine whether the MSB (most significant bit) of said greater value 26CA is a binary "1"? If "yes" go to step 176. If "no" go to step 122. If MSB="1", the value 26CA is sufficiently large to use all digits of the converter 26 with GN=*1 (from step 100). The resolution is then the basic resolution of the apparatus i.e. the resolution based on the divisor $2^{12}=4096$. If MSB="0", the value 26CA uses less than the 12 digits of the converter and the resolution is based on the divisor less than $2^{12}$.

122: Decision to determine whether the NMSB (next most significant bit) is binary "1"? If "yes" go to step 124. If "no" go to step 128.

124: Set the signal GN to *2, i.e. output the corresponding signal 24D to the device 24. Go to step 125. This is appropriate because if the NMSB at step 122 was "1" (the MSB having been "0"), the input to the converter had used only 11 of the 12 digits so that the resolution was based on a divisor $2^{11}$, i.e. one half of the basic resolution.

125: Store GN.

126: Repeat steps 104 to 111. Go to step 172. Repeating steps 104 to 111 applies the gain increase of step 124 to both input signals VA, VB. The resulting values 26CA, 26CB now define digital words W2A, W2B respectively. The word W2A is shown in FIG. 7. The increased gain results in the MSB of the larger of the output values, i.e. the value 26CA, becoming "1" because the output 23C has become large enough to use all the 12 digits of the converter. The resolution, now referred to as the "effective resolution", is again based on a divisor $2^{12}$ and is the optimum resolution which can be achieved with the converter. The effect of this gain increase is equivalent to an additional LSB, denoted LSBX, becoming available to the word W1A, i.e. it is equivalent to the converter 26 having, in this case, n+q digits where q=1.

128, 130: Repeat steps equivalent to steps 122, 124 and increase the signal GN by a further *2, i.e. *4, by switching the resistor 24A to the next terminal 25.

132, 134, 136, 138, 140, 142, 144, 146, 148, 150, 152, 154, 156, 158, 160, 162, 164, 166: Steps 128, 130 are repeated in steps 132, 134 and sequentially through to steps 164, 166.. Whenever an NMSB equal to "1" is encountered, the gain GN is increased and the operation goes to step 125. Thus the program 99 determines whether the most significant end of the value 26CA has at least one binary "0" and, responsive to the presence of at least one binary "0", increases the gain GN by a factor equal to $2^q$, where q is the number of binary "0"s at the most significant end of the value 26CA. In this example the highest gain GN is 2048 at step 166. Such a gain is applicable to the condition, shown at step 164, when the number produced by the converter is such that only the LSB (least significant bit) contains a "1". The amplification *2048 effectively shifts this "1" from the LSB into the MSB position. In practice a limit is set to very high amplifications by system noise, electronic drift and the droop rate of the sample-and-hold circuits 21. A gain of 128 has been achieved in conjunction with a 12 bit converter as a satisfactory compromise between the cost of the converter and good resolution. The gain of 128 notionally adds 7 bits to the capacity of the converter. Thus there is achieved, on the basis of the cost of a 12-bit converter, an effective performance equivalent to that of a 19-bit converter.

172: Decision as to whether the converter 26 is overranged. If "no" go to step 176. If "yes" go to step 174. This situation i.e. an over-ranging of the converter after step 126, occurs only rarely but can occur due to manufacturing tolerances in the equipment. To cope with the over-range condition the gain signal GN is decremented by the divisor 2 and is fed back to step 125.

176: This step executes a derivation of equation (3) to establish the value X and is performed whenever the MSB is "1" (step 118) or has been made "1" as a consequence of step 126. In view of the conversion from IA, IB to VA, VB by the device 19, the value X becomes a function of the ratio of the inputs VA, VB. This is discussed further following the recital of step 178 next below.

178: Set the signal 21D to "1" thereby operating the circuits 21 to release the "hold" condition. The program is now ready for a new cycle.

Reverting to step 176, equation (3) becomes equation (4) below by taking account of the conversion from current to voltage by the device 18 and of the introduction of the gain GA. Thus:

$$[(VA*GA)-(VB*GA)]/[(VA*GA)+(VB*GA)]=1-(2X/L) \quad (4)$$

Figure 6C:
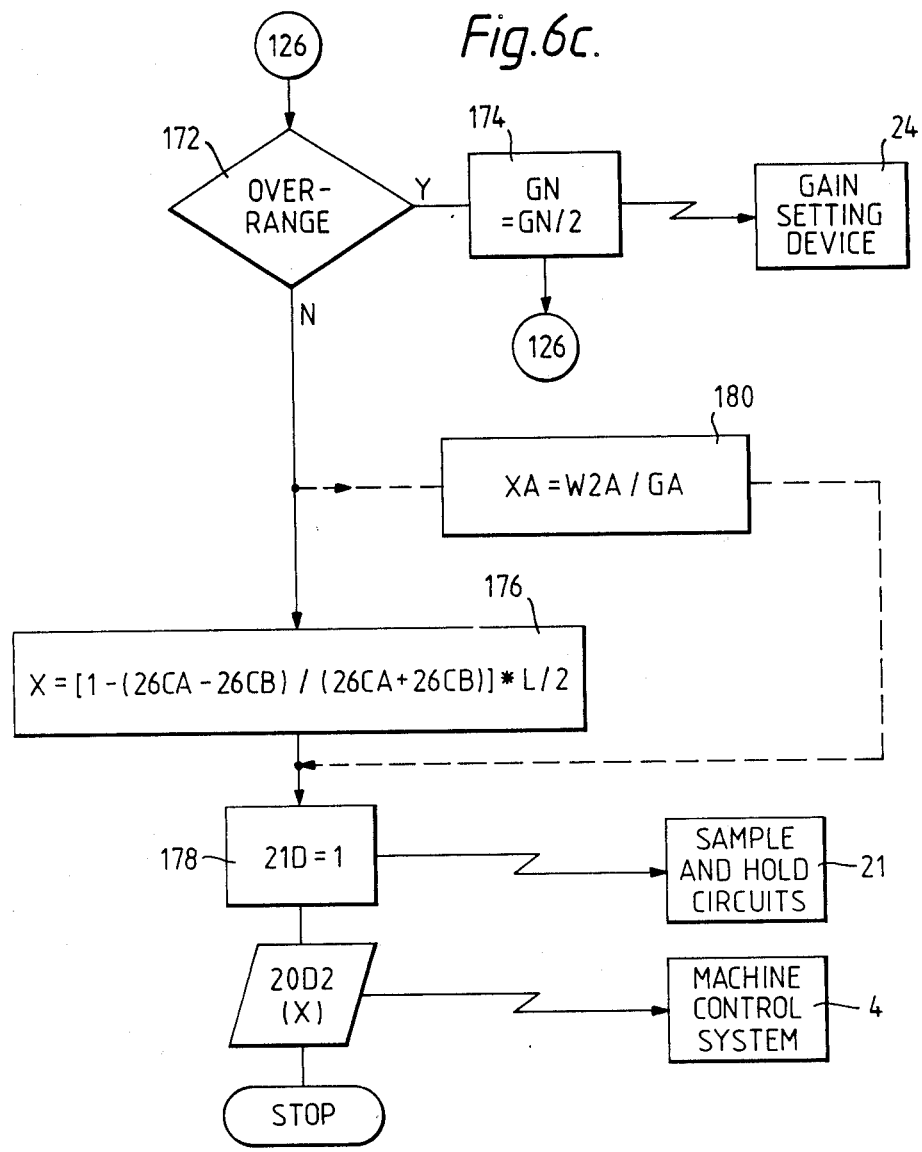

It will be clear that the gain factor GA cancels out so that the equation becomes $$(VA-VB)/(VA+VB)=1-(2X/L) \quad (5)$$

and the gain GA plays no part in the caluculation of X. Since VA≡26CA and VB≡26CB then, as shown in FIG. 6c at step 176, the final equation becomes:

$$X=[1-(26CA-26CB)/(26CA+26CB)]* L/2 \quad (6)$$

The value X is output by the signal 20D2 to the machine control system 4 where it is combined with the output of the machine measuring system 6 to derive the position of the surface 14A in terms of the latter system.

Reverting to equation (5), it will be seen that (VA−VB)/(VA+VB) can vary linearly between −1 and +1. Therefore, in equation (6), X can vary between 0 and L. If the individual values 26A and 26CB are small, the precision to which X can be determined is correspondingly coarse; if these values are large the precision is correspondingly fine. Since the amplification process initiated by the step 126 keeps the numerical values large, there is achieved a corresponding benefit in the precision to which X is determined. In other words, the resolution of X is maintained to the optimum resolution (subject to the conditions explained next below) while the input signals VA, VB may vary significantly.

Since the values of GA are eliminated when going from equation (4) to equation (5), it does not matter if, due to manufacturing tolerances, the values of GA attainable by the device 24 do not conform exactly to the values GN. It is nevertheless desirable that the values of GA conform as closely as possible to the values of GN and commercially obtainable resistor systems 24A satisfy a practical execution of the invention. It can be shown that, in certain conditions a difference between GN and GA can result in occasional failure to attain the condition of MSB="1". One such condition can arise if GA>GN and the input VA or VB is such that the conversion produced by step 126 causes the converter to over-range. This is detected at a step 172. Step 174 then reduces the gain. The result is that the converter may not attain MSB="1". Another such condition can arise if GA<GN and the input is such that the conversion produced by step 126 fails to attain MSB="1". In either of these conditions, if MSB is not "1", the first NMSB is "1" and the numerical content of the converter output is close to what it would be if MSB="1". As a result the values 26CA or 26CB are still relatively large and the loss in said precision or resolution is only marginal.

The computation of the position value X is affected by so-called system offsets, i.e. outputs arising from sources other than the light source 11. To overcome this difficulty the offsets are determined and are stored in the microprocessor system 27 in the form of a table, and the microprocessor system is programmed to ensure that the offset pertaining to each channel A, B at each position 25/1 to 25/n is taken into account in the calculation at step 176. The above table is produced by switching off the light source 11 and then recording the output of the converter 26 for each gain GA at each of the channels A, B in the memory of the microprocessor system. It will be clear that in this way the offsets for the entire apparatus including the probe 9 are determinable. Preferably the table is produced and updated, at frequent intervals, automatically by an appropriate program.

In the example described, use is made of the two channels A, B and the gain GA was eliminated because, by virtue of expression (4), the required output, i.e. the value X, is a function of the ratio between the two inputs VA, VB. In some applications only a single input signal, say the input VA, is required to be processed and the elimination of the gain GA does not arise. In such a case the input VA is fed through one of the circuits 21 and one position of the multiplexer 22 to the amplifier 23, and the following modifications are made to the program. Step 107 is connected directly to step 117 (as shown by a broken line in FIG. 6a) because the channel B is not used and step 116 (FIG. 6b) is by-passed for the same reason.

Further, the "no" output of decision 172 and the "yes" output of decision 118 are connected to a step 180 where the second word W2A is divided by the gain GA to establish a value XA equivalent to the input VA. In this context it is of course necessary to store the gains GA produced at each of steps 100, 124, 130, 134 ... 166.

I claim:

1. Analog-to-digital conversion apparatus for converting an analog input signal into a corresponding digital output signal, said apparatus comprising:
    converter means for converting analog inputs into digital outputs;
    converter control means for controlling said converter means to perform a first conversion to produce a first digital output from the analog input signal;
    means for determining the state of the most significant bit of said first digital output and for producing an output if said most significant bit state is zero;
    variable gain amplifier means having an output connected to said converter means for amplifying said analog input signal;
    gain control means responsive to said determining means output for controlling said gain of said amplifier means such that a second digital output produced by said converter means from said amplifier means output would have a binary one as the most significant bit; and
    said converter control means further controlling said converter means to perform a second conversion to produce said second digital output from said amplifier means output as said digital output signal.

2. Analog-to-digital conversion apparatus according to claim 1 and further comprising:
    sample-and-hold means for connecting the analog input signal to said amplifier means and for holding a sample value of said analog input signal; and
    sample-and-hold control means for controlling said sample-and-hold means to hold said sample value prior to commencement of said first conversion and until completion of said second conversion.

3. Analog-to-digital conversion apparatus for converting a pair of analog input signals into a corresponding pair of digital output signals, said apparatus comprising:
    converter means for converting analog inputs into digital outputs;
    variable gain amplifier means;
    converter control means for connecting the pair of analog input signals sequentially to said converter means via said variable gain amplifier means and for controlling said converter means to perform a first set of conversions to produce a corresponding pair of first digital outputs,
    comparison means for determining which of said first digital outputs is the greater;
    magnitude determining means responsive to said comparison means for determining the state of the most significant bit of the greater said first digital outputs and for producing an output if said most significant bit state is zero;
    gain control means responsive to said magnitude determining means output for controlling the gain of said amplifier means such that a second set of conversions performed by said converter means would produce a pair of second digital outputs wherein the state of the most significant bit of the greater of said second digital outputs is a binary one;
    said converter control means further connecting the pair of analog input signals sequentially to said converter means via said amplifier means and controlling said converter means to perform said second set of conversions to produce said pair of second digital outputs as said pair of digital output signals.

4. Apparatus according to claim 3 further comprising sample-and-hold means for holding sample values of each of said analog input signals; and sample-and-hold control means for controlling said sample-and-hold means to hold said sample values between commencement of said first set of conversions and conclusion of said second set of conversions.

5. Apparatus according to claim 3 further comprising means for producing an output which is a ratio of said second digital outputs, thereby producing a further digital output signal excluding the value of said gain.

6. Apparatus according to claim 4 further comprising means for producing an output which is a ratio of said second digital outputs, thereby producing a further digital output signal excluding the value of said gain.

7. Apparatus for measuring the relative position of an object comprising:
probe means for producing a pair of analog signals having a ratio which is a predetermined function of the relative object position;
converter means for converting analog inputs into digital outputs;
variable gain amplifier means;
converter control means for connecting said pair of analog input signals sequentially to said converter means via said variable gain amplifier means and for controlling said converter means to perform a first set of conversions to produce a corresponding pair of first digital outputs,
comparison means for determining which of said first digital outputs is the greater;
magnitude determining means responsive to said comparison means for determining the state of the most significant bit of the greater one of said first digital outputs and for producing an output if said most significant bit state is zero;
gain control means responsive to said magnitude determining means output for controlling the gain of said amplifier means such that a second set of conversions performed by said converter means would produce a pair of second digital outputs wherein the state of the most significant bit of the greater one of said second digital outputs is a binary one;
said converter control means being responsive to said magnitude determining means output for further connecting said pair of analog input signals sequentially to said converter means via said amplifier means and controlling said converter means to perform said second set of conversions to produce said pair of second digital outputs; and
means for producing an output signal indicative of the relative object position based on the ratio of said pair of second digital outputs, and, if said pair of second digital outputs is not produced, based on the ratio of said pair of first digital outputs.

8. Apparatus according to claim 7, further comprising sample-and-hold means for holding sample values of each of said analog input signals; and
sample-and-hold control means for controlling said sample-and-hold means to hold said sample values between commencement of said first set of conversions and conclusion of said second set of conversions.

9. A method for controlling the resolution of a probe measuring system in which a probe produces a pair of analog signals in response to incident electromagnetic radiation received from an object, the ratio of said pair of analog signals being a predetermined function of the relative position of the object, and the incident electromagnetic radiation being subject to random flucuations affecting the resolution of the probe measuring system, said method comprising the steps of:
performing a first set of analog to digital conversions of said pair of analog input signals to produce a corresponding pair of first digital outputs;
comparing said first digital outputs to determine which is greater;
determining the state of the most significant bit of the greater one of said first digital outputs;
if said most significant bit state is zero: amplifying said pair of analog input signals such that a second set of conversions of said amplified analog input signals would produce a pair of second digital outputs wherein the state of the most significant bit of the greater one of said second digital outputs is a binary one; and performing said second set of conversions of said amplified analog input signals to produce said pair of second digital outputs;
using said pair of second digital outputs, or said pair of first digital outputs if said pair of second digital outputs is not produced, to produce a signal indicative of the relative position of the object.

* * * * *